United States Patent [19]

Booth et al.

[11] Patent Number: 4,715,098

[45] Date of Patent: Dec. 29, 1987

[54] METHOD OF MAKING COAXIAL CABLE

[75] Inventors: Michael Booth, Swindon; Richard J. Penneck, Lechlade, both of England

[73] Assignee: Raychem Limited, England

[21] Appl. No.: 897,470

[22] Filed: Aug. 15, 1986

Related U.S. Application Data

[62] Division of Ser. No. 673,460, Nov. 20, 1984, Pat. No. 4,629,925.

[30] Foreign Application Priority Data

Nov. 22, 1983 [GB] United Kingdom ............... 8331156

[51] Int. Cl.$^4$ .......................................... H04R 17/00
[52] U.S. Cl. ..................................... 29/25.35; 156/50
[58] Field of Search ......................... 29/25.35, 592 E; 156/50; 310/800, 330, 338, 357

[56] References Cited

U.S. PATENT DOCUMENTS

| | | | |
|---|---|---|---|
| 3,750,127 | 7/1973 | Ayers et al. | 310/800 |
| 3,798,474 | 3/1974 | Cassand et al. | 310/9.6 |
| 3,862,477 | 1/1975 | Ayers et al. | 29/25.35 |
| 4,183,010 | 1/1980 | Miller | 367/154 |
| 4,303,733 | 12/1981 | Bulle et al. | 428/367 |
| 4,369,391 | 1/1983 | Micheron | 310/800 |
| 4,378,721 | 4/1983 | Kaneko et al. | 310/800 |
| 4,688,306 | 8/1987 | Soni et al. | 29/827 |

FOREIGN PATENT DOCUMENTS

| | | | |
|---|---|---|---|
| 89770 | 9/1983 | European Pat. Off. | 310/800 |
| 50-7082 | 1/1975 | Japan . | |
| 51-36583 | 3/1976 | Japan . | |
| 56-66081 | 6/1981 | Japan . | |
| 807019 | 1/1959 | United Kingdom | 310/800 |
| 1358168 | 6/1974 | United Kingdom | 310/800 |
| 2012519 | 7/1979 | United Kingdom | 310/800 |
| 2042256 | 9/1980 | United Kingdom | 310/800 |
| 2055018 | 2/1981 | United Kingdom . | |
| 2123602 | 2/1984 | United Kingdom . | |

Primary Examiner—P. W. Echols
Attorney, Agent, or Firm—Yuan Chao; Edith A. Rice; Herbert G. Burkard

[57] ABSTRACT

A piezoelectric coaxial cable comprises a central stretchable electrical conductor (1), preferably formed from a low melting point metal alloy, a piezoelectric intermediate layer (2), preferably formed from a vinylidene fluoride polymer which has been stretched and radially polarized to render it piezoelectric, and an outer electrical conductor (3).

The intermediate layer has a ratio R of its internal radius to its external radius which is preferably not more than 0.5 and more preferably not more than 0.4. This construction enables coaxial cables to be formed without voiding or breaking of the internal conductor during stretching.

15 Claims, 3 Drawing Figures

METHOD OF MAKING COAXIAL CABLE

This application is a continuation division of copending application Ser. No. 673,460 filed Nov. 20, 1984, now U.S. Pat. No. 4,629,925.

This invention relates to coaxial cables and in particular to piezoelectric coaxial cables.

A number of piezoelectric coaxial cables have hitherto been proposed. Such cables comprise a central electrical conductor, an intermediate insulating layer of piezoelectric material surrounding the central conductor, and an outer electrical conductor surrounding the intermediate layer. Piezoelectric coaxial cables have often been proposed for use as transducers since, when they are subjected to an applied pressure, for example caused by impact by an object or acoustic pressure changes, a potential difference will be generated between the electrodes by the piezoelectric material.

In recent years certain polymeric materials, for example polyvinylidine fluoride and vinylidine fluoride copolymers have been suggested for use as piezoelectric materials. In order to maximize the piezoelectric properties of a vinylidine fluoride polymer, it is necessary to orient the polymer by stretching it, preferably up to its "natural" draw ratio of about 4:1 or beyond, in order to convert at least a portion of the polymer from its initial $\alpha$ or form II crystalline form into its $\beta$ phase or form I. Simultaneously with, or subsequent to, the stretching operation, it is necessary to polarize the polymer by applying a high electric field gradient across the polymer in a direction perpendicular to the direction of orientation in order to align the dipoles in the form I phase of the polymer. Electric field gradients of from 5 to 200 $MVm^{-1}$ are typical for the polarizing operation, the maximum applied field gradient usually being determined by dielectric break-down of the polymer material. In the case of piezoelectric materials that are in sheet form, the electrodes used for the polarizing operation may be metal layers that have been deposited after the material has been stretched or, if the sheet is stretched in the nip of a pair of rollers, the rollers themselves may be used as the electrodes. Alternatively, corona discharge electrodes may be used on one or both sides of the sheet, for example as described in U.S. Pat. No. 4,308,370.

In the case of a piezoelectric coaxial cable, in order to maximize its piezoelectric response, the intermediate layer would need to be stretched axially and polarized radially between an inner, central, electrode and an outer electrode. While the outer electrode may be applied to the intermediate layer after stretching, or, if a corona poling method is employed, the cable may be passed through a corona discharge electrode and an outer electrical conductor for the cable subsequently provided, significant problems are encountered in the provision of an internal electrode or conductor for the cable: it is not possible to extrude the intermediate layer onto a conventional metal conductor, e.g. a copper conductor, in that it would then be difficult subsequently to stretch the intermediate layer in order to convert it into form I. This problem has not yet been overcome in a satisfactory manner: the proposals in the prior art have usually either ignored the problem entirely or have required the extrusion of a hollow tube of the polymeric material and the subsequent insertion of an inner conductor. As will be appreciated, however, such methods are suitable only for the production of discrete pieces of coaxial cable of relatively short length.

Thus, there is a need for a piezoelectric coaxial cable based on a piezoelectric polymer that can be manufactured in long lengths by a continuous process. However, when it was attempted to produce such a cable a further problem, which does not appear to have been considered in the prior art, was encountered: if a stretchable central conductor is employed so that both the conductor and the insulating layer are stretched, it is found that the internal diameter of the insulating layer will not usually contract by as much as the outer diameter of the central conductor contracts when the two are drawn down, with the result that breaks or voids are formed either within the central conductor leading to loss of electrical continuity, or between the central conductor and the insulating layer leading to loss of piezoelectric effect.

According to one aspect, the invention provides a piezoelectric coaxial cable, which comprises a central electrical conductor, an outer electrical conductor and an intermediate piezoelectric layer, the central conductor and the intermediate layer having been axially stretched and the intermediate layer having been radially polarized to render it piezoelectric, and the intermediate layer having an internal radius that is not more than 0.5 times its external radius.

Preferably the internal radius of the intermediate layer is not more than 0.4 times, more preferably not more than 0.35 times the external radius thereof. Most preferably the internal radius of the intermediate layer is about 0.33 times its external radius although it is possible for the internal radius to be smaller, e.g. less than 0.3 times its external radius. In general the ratio of the internal radius to the external radius of the intermediate layer does not change significantly when the conductor and the intermediate layer are stretched, provided that they lie in the above range, so that the above ratios are also preferred for the intermediate layer radii before stretching. By choosing such a configuration for the intermediate layer it is possible to avoid the formation of voids within the central conductor or between the conductor and intermediate layer, even for relatively thick walled coaxial cables in which the problem of void formation is particularly pronounced. Thus the cable according to the invention may have an intermediate layer of wall thickness of at least 0.2 mm, preferably at least 0.3 mm, more preferably at least 0.4 mm, and most preferably at least 0.5 mm, which allows the piezoelectric sensitivity of the cable to be increased.

It has been observed that the maximum wall thickness of the intermediate layer and the maximum valve of the ratio R of the internal radius of the intermediate layer to the external radius of the intermediate layer depend on one another and also depend on the temperature at which the intermediate layer is stretched. In general, the maximum wall thickness of the intermediate layer that can be obtained without the formation of voids or breaks in the central conductor decreases as the ratio R of the internal radius to the external radius of the intermediate layer increases, for any given stretching temperature. Also, the maximum wall thickness increases for any given ratio R as the stretching temperature increases. However, the piezoelectric response of the resulting cable will suffer if the stretching and/or poling temperature is raised to too high a level, due to poor form II to form I conversion of the polymer forming the intermediate layer and/or due to thermal depoling of the polymer following the poling step. For this reason it is preferred to stretch the wire at temperatures not more than 140° C. and preferably not more than 130° C. At these temperatures it has been found that voiding of the central conductor can be prevented if the ratio R of the internal radius to the external radius of the intermediate layer (after stretching) satisfies the empirical inequality:

$$R \leq 0.75 - 0.55T$$

or $$T \leq 1.4 - 1.8R$$

where T is the wall thickness of the intermediate layer after stretching, measured in millimeters.

At a stretching temperature of 125° C. the ratio R and thickness T preferably satisfy the inequality:

$$R \leq 0.67 - 0.55T$$

or $$T \leq 1.2 - 1.8R$$

While it is preferred for the internal radius of the intermediate layer to be as small as possible with respect to its external radius, for practical reasons the internal radius is usually not less than 0.1 times, e.g. not less than 0.2 times the external radius thereof. Accordingly the preferred coaxial cables according to the invention will have an internal conductor radius of from 0.2 to 0.45 times the external radius of the intermediate layer and an intermediate layer wall thickness of from 0.4 to 0.8 mm.

Although the cable is described herein as a "coaxial cable", this term is not intended to imply that the central conductor and the outer conductor must be exactly concentric, but rather it is intended to mean that the central conductor is surrounded by, and insulated from, the outer conductor by the intermediate layer. It will be appreciated by those skilled in the art that some deviation from absolute concentricity is the rule in coaxial cables, and in some cases this may be intended.

The intermediate layer may be formed from any material that can be rendered piezoelectric by orientation and polarizing. Such materials include nylon 5, nylon 7, polyhydroxybutyrate, vinylidine cyanide/vinyl acetate copolymers and vinylidine fluoride polymers. The term "vinylidine fluoride polymer" is intended to include polyvinylidine fluoride, commonly abbreviated to "PVDF" or "PVF$_2$" and those copolymers of vinylidine fluoride in which a piezoelectric activity may be generated or enhanced by orientation and polarizing. Suitable copolymers include copolymers and terpolymers of vinylidine fluoride with vinyl fluoride, trifluoroethylene, tetrafluoroathylene, vinyl chloride, and chlorotrifluoroethylene. In addition, blends of vinylidine fluoride polymers with other polymers, e.g. polymethymethacrylate, are included provided that the piezoelectric activity thereof is not destroyed. Preferably the intermediate layer comprises a vinylidine fluoride polymer, more preferably polyvinylidine fluoride and especially it consists substantially solely of polyvinylidine fluoride.

Preferably the central conductor comprises a low melting point metal so that the central conductor and the intermediate layer can be heated to melt the metal and then stretched while the metal is still liquid. In theory any metal having a melting point that is sufficiently low to allow the metal to melt without thermally degrading or melting the intermediate layer may be used, and in some cases, for reasons discussed below, it is desirable to select a metal having as high a melting point as possible having regard to the softening point of the intermediate layer and having regard to the preferred stretching temperature. Preferably the metal has a melting point of not more than 170° C., more preferably not more than 160° C. and most preferably not more than 150° C. Also it is preferred for the metal to have a melting point of at least 50° C., more preferably at least 60° C., and most preferably at least 70° C. The metal forming the central conductor may be formed from an alloy having a eutectic composition in which case it will exhibit a single, well defined, melting point, or it may be formed from a non-eutectic alloy, in which case the metal may enter a phase between the solidus and liquidus lines of its phase diagram in which its ductility increases with temperature. It is not necessary for the metal to melt completely for the stretching operation, provided that it becomes sufficiently ductile that it will not fracture.

In some instances, where it is possible to employ metals having melting points below about 100° C., it may be desirable to use bismutch containing alloys that expand as they solidify from the melt.

Examples of low melting point alloys that may be used for the central conductor are shown in table I.

TABLE I

| Alloy Number | Components (percent by weight) | | | | | Melting Point (°C.) |
|---|---|---|---|---|---|---|
| | Bi | Sn | Pb | Cd | In | |
| 1 | | 54 | 26 | | 20 | |
| 2 | 49 | 15 | 18 | | 18 | 58–69 |
| 3 | 50 | 13 | 27 | 10 | | 70–73 |
| 4 | 57 | 17 | | | 26 | 79 |
| 5 | | 42 | | 14 | 44 | 93 |
| 6 | 38 | 15 | 31 | 16 | | 70–97 |
| 7 | | 50 | | | 50 | 118–125 |
| 8 | | 51 | 31 | 18 | | 143 |

It has been observed, in piezoelectric coaxial cables according to the invention that employ a low melting point metal as the central conductor, that decreasing the internal radius of the intermediate layer in relation to its external radius causes the hydrostatic piezoelectric charge response of the cable to increase.

As mentioned above, it may be desirable in certain instances to select a metal having as high a melting point as possible having regard to the other materials used and to the processing conditions. This is because, as a general rule, the modulus of a metal increases with its melting point, and it may be desired to employ a metal having as high a tensile (Young's) modulus as possible as shown in published U.K. Patent Application No. 2,150,346 (1985) entitled "Coaxial Cable" and, the disclosure of which is incorporated herein by reference. This is because, as described in the above patent application, it has been found that the hydrostatic piezoelectric response of a piezoelectric cable employing a low melting point alloy central conductor increases significantly with the modulus of the metal.

According to another aspect, the invention provides a method of forming a piezoelectric cable, which comprises the steps of:
(a) forming a wire comprising a central electrical conductor that is capable of being stretched, and, surrounding the central conductor, an insulating layer comprising a material that is capable of being rendered piezoelectric by being oriented and polarized;
(b) axially stretching the wire to orient the insulating layer and to form a wire in which the insulating layer has an internal radius that is not more than 0.5 times its external radius:
(c) simultaneously with, or subsequent to, step (b), radially polarizing the insulating layer; and
(d) providing the stretched wire with an outer electrical conductor.

The dimensions of the resulting cable are preferably as described above. Since the absolute value of the wall thickness of the cable decreases as the conductor and intermediate layer are stretched, the intermediate layer preferably has a wall thickness prior to stretching of at least 0.3, more preferably at least 0.5, especially at least 0.8 and most especially at least 1.0 mm.

The preferred materials for forming the insulating layer and the central conductor are those described above.

The wire should be heated to an elevated temperature before it is stretched in order to melt the central conductor, if a low melting point metal is used, and to raise the insulating layer to a suitable stretching temperature, e.g. a temperature in the range of from 50° to 170° C., preferably from 60° to 150° C. and especially from 80° to 130° C.

If the wire is stretched at temperatures of 110° C. to 130° C., then the ratio R of the internal radius of the intermediate layer to its external radius (prior to stretching) preferably satisfies the inequality:

$$R \leq 0.67 - 0.28 T_u$$

where $T_u$ is the wall thickness of the intermediate layer prior to stretching, measured in millimeters.

The wire may be heated in any of a number of ways. For example it may be heated by means of a hot-air gun or it may be passed through an oven which may itself be heated by an electric resistance heater or by gas. Other methods of heating the wire which may be used in combination with one another include the use of a microwave heating source, induction heating coil, infrared radiation source, a hot liquid bath e.g. a glycerine bath, or electric resistance heating of the central conductor. The particular method of heating the wire will depend on a number of factors including the desired stretching temperature (which will itself depend on the required piezoelectric sensitivity of the cable) and the choice of material used as the central conductor. In some instances it may be preferred for the process to be conducted so that the inner portion of the insulating layer is at a higher temperature than the outer portion thereof. Not only does such a temperature difference across the insulating layer allow the use of somewhat higher melting point metals without the polymer temperature being too high for effective conversion to form I, but also it is currently believed that this may assist the radial contraction of the insulating layer when the wire is stretched, thereby reducing the possibility of void formation within the central conductor or between the central conductor and the insulating layer. This may conveniently be achieved either by allowing the wire to cool for a number of seconds after it has been heated, or by first heating the wire e.g. by a microwave source or in a heating bath or hot air zone followed by a short period of forced cooling.

Preferably the wire is stretched to the "natural" draw ratio of the insulating layer if such a ratio exists, for example about 3.5 to 4.5 times its original length in the case of a vinylidine fluoride polymer, although it is possible to stretch the wire to a lesser or greater extent if desired.

The stretched wire may be provided with an outer electrical conductor either before or after the insulating layer has been polarized. Thus, for example, the wire may be stretched, provided with a deposited metal outer conductor and then polarized by application of a high D.C. potential to the inner and outer conductors. Preferably, however, the outer electrical conductor is provided after the insulating layer has been polarized, in which case the insulating layer is preferably polarized by means of a corona discharge; the wire being passed through an annular corona discharge electrode while the other electrode for the polarizing operation is provided by the central conductor. If the outer conductor is provided after the polarizing step, it is convenient for the stretching step (b) and the polarizing step (c) to be conducted substantially simultaneously, that is to say, so that at least part of the polarizing step coincides with at least part of the stretching step. It is not necessary for both steps to have the same duration: it may be desirable for polarization (commonly referred to as "poling") to carry on after stretching has been completed.

In the preferred method at least the stretching step (b) and the polarizing step (c) are conducted as a continuous process in which wire formed in step (a) of indefinite length is passed through a heating zone in which the wire is heated to a predetermined elevated temperature, and the heated wire is passed through a stretching zone and a polarizing zone and then through a cooling zone, such that, at any instant, only a portion of the wire is at or above the predetermined elevated temperature.

According to yet another aspect, the invention provides a method of forming a piezoelectric cable, which comprises the steps of:
(a) forming a wire comprising a central electrical conductor that is capable of being stretched, and, surrounding the central conductor, an insulating layer comprising a material that is capable of being rendered piezoelectric by being oriented and polarized;
(b) passing the wire through a heating zone in which the wire is heated to a predetermined elevated temperature;
(c) passing the heated wire through a stretching zone and a polarizing zone so that the wire is stretched and, simultaneously or subsequently, the insulating layer is polarized; and
(d) providing the stretched wire with an outer electrical conductor.

The stretching zone and the polarizing zone may occur at different positions along the path of the wire so that it is stretched and poled sequentially, or they may occur in the same position so that stretching and polarizing occur simultaneously. When polyvinylidine fluoride is stretched to its natural draw ratio in a continuous process, it is observed to "neck" at a certain point, that is to say, the lateral dimensions abruptly decrease at a particular point as it is stretched. It is preferred for the wire to be polarized at the point at which it necks.

Another advantage of the invention is that it enables a piezoelectric coaxial cable to be formed in which the intermediate piezoelectric layer is substantially free of voids.

Preferably the wire is formed in step (a) by co-extruding the central conductor and the insulating layer so that long lengths of wire may be formed. The stretching and polarizing steps may be conducted immediately after the wire has been formed or it may be spooled and stored before stretching and polarizing.

The outer electrical conductor may be provided by a number of means in known manner. For example it may be painted on using a metal paint or a metal may be deposited by an electroless deposition method, for example as described in U.S. Pat. No. 4,180,602, the disclosure of which is incorporated herein by reference. Other methods include evaporation, sputtering techniques, or ion beam plating. Alternatively the outer electrode may be provided as a braid in known manner. Combinations of these forms of conductor are also possible.

A coaxial cable and a method of forming it will now be described by way of example with reference to the accompanying drawings, in which.

Figure 1:
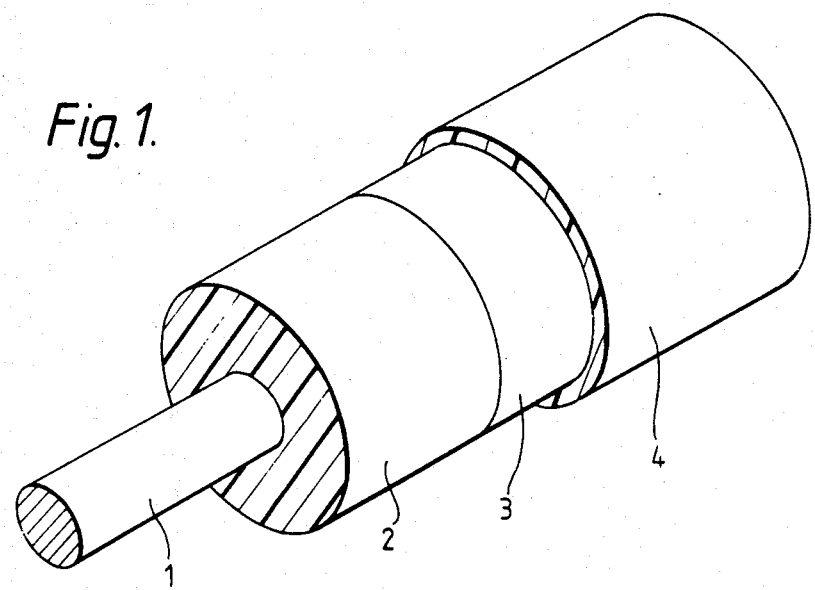
FIG. 1 is an isometric view of part of a coaxial cable according to the invention.

Referring to FIG. 1 a piezoelectric coaxial cable comprises a central conductor 1 formed from one of the alloys shown in table I, an intermediate insulating layer 2 formed from polyvinylidine fluoride and an outer conductive layer 3 formed from silver paint. The radius of the central conductor, and therefore the internal radius of the insulating layer is 0.3 times the external radius of the insulating layer.

The cable may optionally be provided as shown with a polymeric jacket 4, for example formed from polyvinylidine fluoride, polyethylene, ethylene vinyl acetate copolymers and the like.

Figure 2:
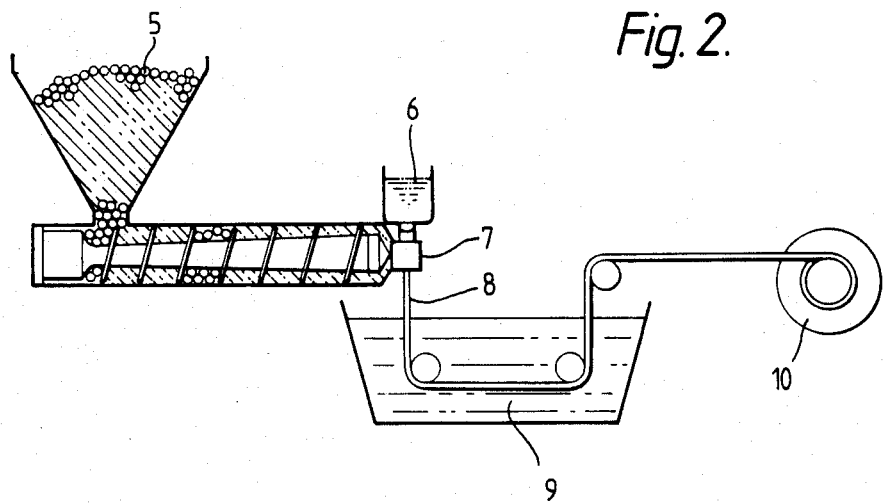
FIG. 2 is a schematic view of the formation of unstretched wire.
Figure 3:
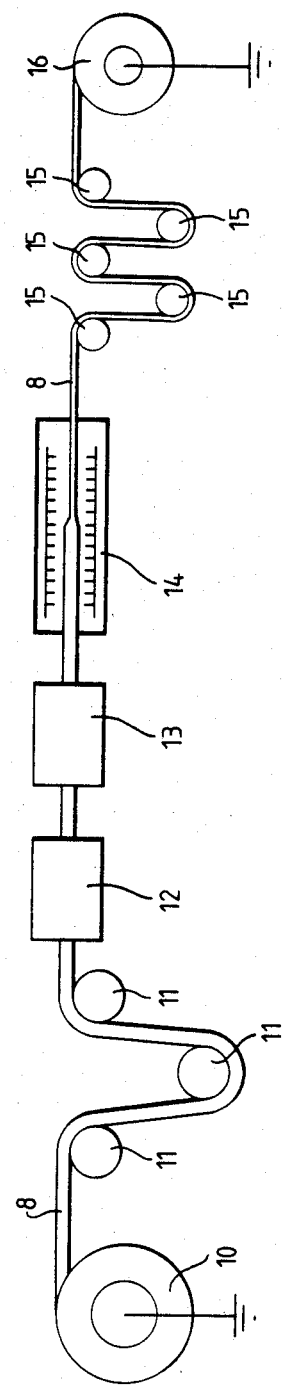
FIG. 3 is a schematic view of the stretching and polarizing of the wire.

FIGS. 2 and 3 show schematically the formation of the wire and then stretching and polarizing it. Polyvinylidine fluoride pellets 5 and low melting point metal alloy 6 are fed into an extruder fitted with a co-extrusion die 7. The die 7 is designed so that the internal and external radii of the polyvinylidine fluoride layer will have the appropriate ratio. As soon as the wire 8 is formed it is passed through a cooling bath 9 and quenched to ambient temperature and is then wound onto a take-up spool 10. The leading end of the wire 8 is kept accessible as the wire is wound onto the spool 10.

The spool 10 is then used as a feed spool in the next stage of the process shown in FIG. 3. The wire is taken off spool 10, passed through feed rollers 11, heating zone 12, cooling zone 13, temperature controlled polarizing zone 14, traction rollers 15 and then to take-up spool 16. The central conductor 1 is electrically connected to both the spool 10 and the spool 16 which are earthed. The traction rollers 15 are adjusted so that their peripheral speed is four times that of the feed rollers 11, thereby causing the wire 4 to stretch by 4:1 as it passes between them. As the wire leaves the feed rollers 11 it passes through a heating zone 12 in the form of a glycerine bath which heats the wire to a uniform temperature in the range of from 100° to 170° C. depending on the metal used for the central conductor. The heated wire passes through a cooling zone 13 in which it is briefly cooled by cold air to reduce the temperature of the external surface of the wire by about 20° to 50° C., and then, optionally via pinch rollers (not shown), through the polarizing zone 14 in which it is subjected to a corona discharge of up to about 40 kV.

The polarizing zone is so located, and its temperature is so adjusted, that the wire neckes down at this stage. After having been polarized, the wire 8 passes through the traction rollers 15 which are maintained at ambient temperature and so cool the wire, and the wire is then taken up by the take-up spool 16.

After this process the wire is ready to have an outer conductor deposited thereon in known manner. For example, an aluminium layer of about 50 to 60 nanometers thickness may be deposited by sputtering, or a silver layer of 25 micrometers typical thickness may be applied by painting or spraying.

The following Examples illustrate the invention:

EXAMPLE 1

A sample of piezoelectric cable was formed by co-extruding a central conductor formed from alloy No. 4 in Table I and polyvinylidine fluoride so that the central conductor radius and the polymer insulating layer internal radius ($a_u$) was 0.48 mm and the insulating layer external radius ($b_u$) was 1.5 mm. The wire was stretched at a mean temperature of about 120° C. to a draw ratio of 4:1 and was simultaneously poled by a corona discharge having a 35 kV potential difference. The resulting wire was provided with a silver outer electrode using silver paint sold under the trademark "Electrodag".

The internal radius of the stretched insulating layer ($a_s$) was 0.24 mm and its external radius ($b_s$) was 0.75 mm giving a wall thickness of 0.51 mm and a ratio $a_s/b_s$ of 0.32. The value $(a_u/a_s)^2$ is equal to 4 and so is equal to the draw ratio, indicating that the total internal volume enclosed by the intermediate layer did not increase on stretching.

The cable could be formed continuously in long lengths and exhibited a piezoelectric coefficient in the 1 direction ($d_{31}$) of 25 pCN$^{-1}$ and a hydrostatic piezoelectric coefficient ($d_{3h}$) of 8–10 pCN$^{-1}$.

EXAMPLE 2

Example 1 was repeated with the exception that alloy No. 6 of table I was used for the central electrode and the dimensions were as shown in table II below. The cable had a hydrostatic piezoelectric coefficient ($d_{3h}$) of 11–14 pCN$^{-1}$ and a $d_{31}$ coefficient of 35 pCN$^{-1}$.

EXAMPLE 3

Example 2 was repeated with the exception that the size of the central conductor and the intermediate insulating layer were adjusted to give a relatively low value for the ratio of the internal radius of the insulating layer (a) to its external radius (b). The dimensions are shown in Table II.

Example 4

Example 1 was repeated with the exception that alloy No. 6 of table I was used as the central conductor, the mean stretching temperature was 125° C. and the dimensions were as shown in Table II.

EXAMPLE 5

Example 4 was repeated with the exception that, as shown in Table I, the wall thickness was relatively high (1.48 mm before stretching and 0.79 mm after stretching) and a relatively low ratio R (0.23 to 0.25). This cable exhibited a few breaks in its central conductor but the breaks were spaced apart by lengths of continuous conductor so tht the cable could be cut and used in discrete lengths.

EXAMPLE 6 (comparison)

Example 4 was repeated with the exception that the cable had a ratio R before stretching of 0.5 and after stretching of 0.54 and that the initial wall thickness of the intermediate layer was 0.78 mm which reduced to 0.38 mm after stretching. Considerable breaking and voiding of the central conductor was observed.

EXAMPLE 7 (comparison)

Example 1 was repeated with the exception that the wire formed from the central conductor and the intermediate layer was stretched between the jaws of an "Instron" (trademark) tensometer instead of being stretched by the preferred continuous process according to the invention and that alloy No. 1 of Table I was used as the central conductor. The dimensions are shown in table II.

TABLE II

| Example | $a_u$ (mm) | $a_s$ (mm) | $b_u$ (mm) | $b_s$ (mm) | Initial Wall Thickness $(b_u - a_u)$ mm | Final Wall Thickness $(b_s - a_s)$ mm | $R_u = \frac{a_u}{b_u}$ | $R_s = \frac{a_s}{b_s}$ | Draw Ratio |
|---|---|---|---|---|---|---|---|---|---|
| 1 | 0.48 | 0.24 | 1.5 | 0.75 | 1.02 | 0.51 | 0.32 | 0.32 | 4 |
| 2 | 0.44 | 0.22 | 1.32 | 0.73 | 0.88 | 0.51 | 0.33 | 0.31 | 4 |
| 3 | 0.265 | 0.13 | 1.20 | 0.63 | 0.935 | 0.50 | 0.21 | 0.21 | 4 |
| 4 | 0.45 | 0.22 | 0.93 | 0.52 | 0.48 | 0.30 | 0.48 | 0.42 | 4 |
| 5 | 0.50 | 0.24 | 1.99 | 1.03 | 1.48 | 0.79 | 0.25 | 0.23 | 4 |
| 6 | 0.79 | 0.45 | 1.57 | 0.83 | 0.78 | 0.38 | 0.50 | 0.54 | 4 |
| 7 | 0.91 | 0.63 | 1.98 | 1.15 | 1.07 | 0.52 | 0.46 | 0.55 | 3.8 |

Table III shows the value of $R_s - (0.67 - 0.55T)$ which will be zero or negative if the inequality I above is satisfied, and also shows the value of $(a_s/a_u)^2 \times D$ which corresponds to the ratio of the volume available for the central conductor after stretching to the volume occupied by it before stretching. Thus a value above unity indicates that voids will occur between the central conductor and the intermediate layer or that breaks will occur within the central conductor.

The cables according to Examples 1 to 4 were all stretched satisfactorily. The cable according to Example 5 was borderline and exhibited a few breaks at intervals, and the cables according to Examples 6 and 7 both exhibited voiding or breaking of the central conductor and separation from the intermediate layer.

TABLE III

| Example | $R_s = \frac{a_s}{b_s}$ | Final wall thickness T $(b_s - a_s)$ mm | $R_s - (0.67 - 0.55 T)$ | $(a_s/a_u)^2 \times D$ |
|---|---|---|---|---|
| 1 | 0.32 | 0.51 | −0.0695 | 1.00 |
| 2 | 0.31 | 0.51 | −0.0795 | 1.00 |
| 3 | 0.21 | 0.50 | −0.015 | 0.96 |
| 4 | 0.42 | 0.30 | −0.085 | 0.96 |
| 5 | 0.23 | 0.79 | −0.005 | 0.92 |
| 6 (Comparison) | 0.54 | 0.38 | +0.079 | 1.29 |
| 7 (Comparison) | 0.55 | 0.52 | +0.166 | 1.82 |

We claim:

1. A method of forming a piezoelectric coaxial cable, which comprises the steps of:
    (a) co-extruding a central metallic electrical conductor, and surrounding the conductor with an insulating layer to form a wire, the insulating layer comprising a material that is capable of being rendered piezoelectric by being oriented and polarized;
    (b) subjecting the wire to a continuous polarizing operation comprising:
        (i) passing the wire through a heating zone in which the wire is heated to a predetermined elevated temperature to melt the electrical conductor, and
        (ii) passing the heated wire through a stretching zone and a polarizing zone so that the wire is stretched and, simultaneously or subsequently, the insulating layer is polarized, the insulating layer of the stretched wire having an internal radius that is not more than 0.5 times its external radius; and
    (c) providing the stretched wire with an outer electrical conductor.

2. A method as claimed in claim 1, wherein the insulating layer of the stretched wire has an internal radius that is not more than 0.4 times its external radius.

3. A method as claimed in claim 1, wherein the insulating layer has a wall thickness, after stretching, of at least 0.3 mm.

4. A method as claimed in claim 1, wherein the wire is stretched to a length in the range of from 3.5 to 4.5 times its original length.

5. A method as claimed in claim 1, wherein, prior to stretching, the ratio R of the internal radius of the intermediate layer to the external radius of the intermediate layer satisfies the inequality:

$$R \leq 0.67 - 0.28\, T_u$$

wherein $T_u$ is the wall thickness of the intermediate layer prior to stretching, measured in millimeters.

6. A method as claimed in claim 1, wherein, prior to stretching, the insulating layer has an internal diameter that is less than 0.5 times its external diameter.

7. A method as claimed in claim 6, wherein, prior to stretching, the insulating layer has an internal diameter that is less than 0.4 times its external diameter.

8. A method as claimed in claim 1, wherein, prior to stretching, the insulating layer has a wall thickness of at least 0.5 mm.

9. A method as claimed in claim 8, wherein, prior to stretching, the insulating layer has a wall thickness of at least 1.0 mm.

10. A method as claimed in claim 1, wherein after stretching the Ratio R of the internal radius of the intermediate layer to the external radius of the intermediate layer satisfies the inequality:

$$R \leq 0.67 - 0.55 T$$

wherein T is the wall thickness of the intermediate layer after stretching, measured in millimeters.

11. A method as claimed in claim 1, wherein the central conductor comprises a metal that is caused to melt in order to enable it to stretch during step (b).

12. A method as claimed in claim 1, wherein the wire is heated so that during stretching the intermediate layer is at a mean temperature in the range of from 120° to 130° C.

13. A method as claimed in claim 1, wherein, during step (b), the inner portion of the insulating layer is at a higher temperature than the outer portion of the insulating layer.

14. A method as claimed in claim 1, wherein the insulating layer is polarized by corona discharge.

15. A method as claimed in claim 1, wherein the insulating layer comprises a vinylidine fluoride polymer.

* * * * *